US006627868B2

(12) United States Patent
Bois et al.

(10) Patent No.: US 6,627,868 B2
(45) Date of Patent: Sep. 30, 2003

(54) BI-FUNCTIONAL OPTICAL DETECTOR INCLUDING FOUR OPTICAL DETECTORS USED TO DETECT COMBINATION OF TWO WAVELENGTHS

(75) Inventors: Philippe Bois, Cesson (FR); Eric Costard, Massy (FR); Marcel-Francis Audier, Paris (FR); Eric Herniou, Gif sur Yvette (FR)

(73) Assignee: Thomson-CSF, Paris (FR)

( * ) Notice: Subject to any disclaimer, the term of this patent is extended or adjusted under 35 U.S.C. 154(b) by 85 days.

(21) Appl. No.: 09/852,211

(22) Filed: May 10, 2001

(65) Prior Publication Data
US 2002/0008193 A1 Jan. 24, 2002

(30) Foreign Application Priority Data
May 12, 2000 (FR) .............................. 00 06072

(51) Int. Cl.[7] .............................................. H01L 27/14
(52) U.S. Cl. ....................... 250/214.1; 250/208.1; 250/226; 257/21; 438/69; 438/98; 438/602
(58) Field of Search .......................... 250/214.1, 226, 250/208.1; 356/402, 403; 257/14, 17, 21; 438/60, 69, 70, 73–75, 77, 80–87, 93, 94, 95, 602–609

(56) References Cited

U.S. PATENT DOCUMENTS

| 5,086,327 A | 2/1992 | Rosencher et al. |
| 5,187,715 A | 2/1993 | Weisbuch et al. |
| 5,228,777 A | 7/1993 | Rosencher et al. |

(List continued on next page.)

FOREIGN PATENT DOCUMENTS

| EP | 0 849 798 | 6/1998 |
| EP | 0 849 799 | 6/1998 |
| EP | 0 999 600 | 5/2000 |
| WO | WO 98/45884 | 10/1998 |

OTHER PUBLICATIONS

Erli Chen et al., "A Novel Device for Detecting the Polarization Direction of Linear Polarized Light Using Integrated Subwavelength Gratings and Photodetectors" IEEE Photonics Technology Letters, US, IEEE Inc. New York, vol. 9, No. 9, Sep. 1, 1997 pp. 1259–1261.
Steven J. Schablitsky et al., "A wavelength and polarization detector using monolithically integrated subwavelength MSM photodetectors" 1997 55th Annual Device Research Conference Digest (Cat. No. 97TH8279), 1997 55th Annual Device Research Conference Digest, Fort Collins, Co, Jun. 23–25, 1997, pp. 168–169.

Primary Examiner—Stephone B. Allen
(74) Attorney, Agent, or Firm—Oblon, Spivak, McClelland, Maier & Neustadt, PC

(57) ABSTRACT

A bi-functional optical detector including a first active photoconduction detection element configured to detect light within first and second wavelength ranges, a first diffraction grating associated with the first detection element and configured to couple the light within the first wavelength range so that the first active photoconducting detection element detects the light in the first wavelength range, a second active photoconduction detection element configured to detect light within the first and second wavelength ranges, and a second diffraction grating associated with the second detection element and configured to couple the light within the second wavelength range so that the second active photoconduction detection element detects the light in the second wavelength range. Also included is a third active photoconduction detection element associated with the first detection element and configured to detect the light within the first and second wavelength ranges, a fourth active photoconduction detection element associated with the second detection element and configured to detect the light within the first and second wavelength ranges, and a common contact layer separating the first and second detection elements from the third and fourth detection elements.

21 Claims, 3 Drawing Sheets

U.S. PATENT DOCUMENTS

| | | |
|---|---|---|
| 5,326,984 A | 7/1994 | Rosencher et al. |
| 5,506,418 A | 4/1996 | Bois et al. |
| 5,552,603 A * | 9/1996 | Stokes .................... 250/338.4 |
| 5,677,544 A | 10/1997 | Duboz et al. |
| 5,712,499 A | 1/1998 | Duboz et al. |
| 5,719,670 A | 2/1998 | Duboz et al. |
| 5,726,500 A | 3/1998 | Duboz et al. |
| 5,812,190 A | 9/1998 | Audier et al. |
| 5,869,844 A | 2/1999 | Rosencher et al. |
| 5,998,777 A | 12/1999 | Audier et al. |
| 6,091,126 A | 7/2000 | Costard et al. |
| 6,157,020 A | 12/2000 | Krapf et al. |
| 6,184,538 B1 * | 2/2001 | Bandara et al. ............... 257/21 |
| 6,355,939 B1 * | 3/2002 | Dodd .......................... 257/21 |

\* cited by examiner

| | APPLIED POLARIZATIONS | POLARIZATION $V_1$ | POLARIZATION $V_2$ | POLARIZATION $V_{ref}$ |
|---|---|---|---|---|
| MODE 1 | SUBSTRACTIVE $\lambda_1$ | YES | NO | YES |
| MODE 2 | SUBSTRACTIVE $\lambda_2$ | NO | YES | YES |
| MODE 3 | SUBSTRACTIVE $\lambda_1 + \lambda_2$ | YES | YES | YES |

BI-FUNCTIONAL OPTICAL DETECTOR INCLUDING FOUR OPTICAL DETECTORS USED TO DETECT COMBINATION OF TWO WAVELENGTHS

BACKGROUND OF THE INVENTION

The invention relates to a bi-functional optical detector for detecting two wavelengths while eliminating background noise.

The purpose of this invention is to describe the architecture for combining two specific previously demonstrated functions of quantum well detectors, namely the possibility of making bi-spectral devices (French patent No. 2 756 667) and the possibility of making detectors integrating the subtraction function of the continuous component in the active layer, in other words the darkness current due to thermal causes and the optical scene current (French patent No. 2 756 666). Each of these two functions requires a double stack of quantum wells and a 3-stage connection. With the invention, this number of stacks and connection stages can be kept while enabling reading in subtractive mode according to three spectral curves, namely $\lambda_1$, $\lambda_2$ and $\lambda_1+\lambda_2$.

SUMMARY OF THE INVENTION

Therefore, the invention relates to a bi-functional optical detector comprising:

a first active photoconduction detection element capable of detecting a first range and a second range of wavelengths, associated with a first diffraction grating that it uses to couple the light from the first range of wavelengths in this first detection element, so that the first active photoconduction detection element can detect light in the first range of wavelengths;

a second active photoconduction detection element capable of detecting a first range and a second range of wavelengths, associated with a second diffraction grating that it uses to couple the light from the second range of wavelengths in this second detection element, so that the second active photoconduction detection element can detect light in the second range of wavelengths.

The invention also relates to a process for making this type of detector.

BRIEF DESCRIPTION OF THE DRAWINGS

The various purposes and characteristics of the invention will become clear after reading the description and the attached figures.

DETAILED DESCRIPTION OF THE DRAWINGS

Figure 1:
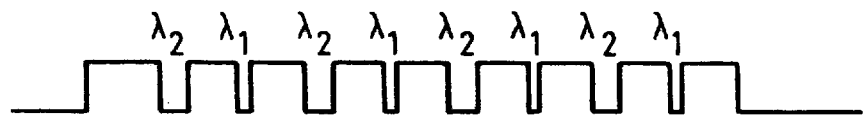
FIG. 1, showing a quantum well structure for detecting two ranges of wavelengths.
Figure 2:
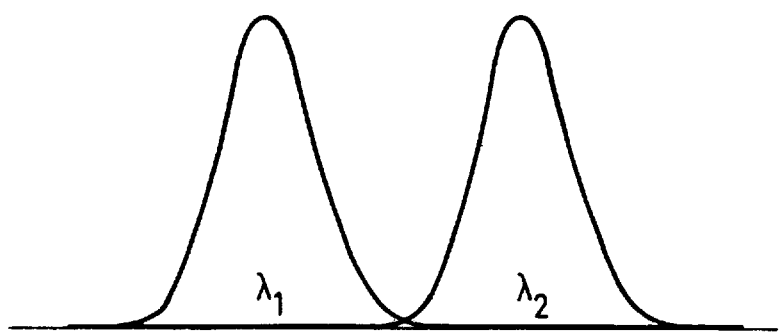
FIG. 2, the spectral curve for the quantum well structure in FIG. 1.

The proposed architecture is identical to the architecture for a subtraction component like that described in French patent No. 2 756 666, but in this case each of the two active layers is composed of an alternation of two patterns of quantum wells (FIG. 1), drawn for absorption and detection at two wavelengths $\lambda_1$ and $\lambda_2$ with two spectral curves $\Delta\lambda_1$ and $\Delta\lambda_2$. The resulting spectral curve is the sum of the two spectral curves $\Delta\lambda_1$ and $\Delta\lambda_2$ (FIG. 2). The manufacture of this type of quantum well detection structure was described by S. Bandara et al., APL 72, p.2427 (1998).

Figure 4:
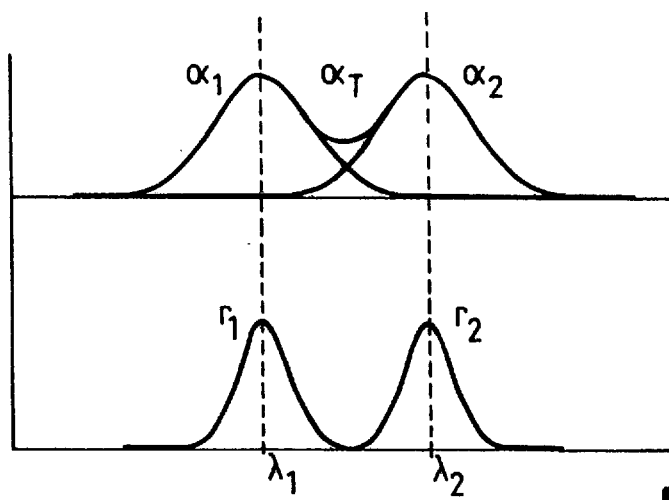
FIG. 4, the absorption and the response induced by the gratings in the structure in FIG. 3.
Figure 3:
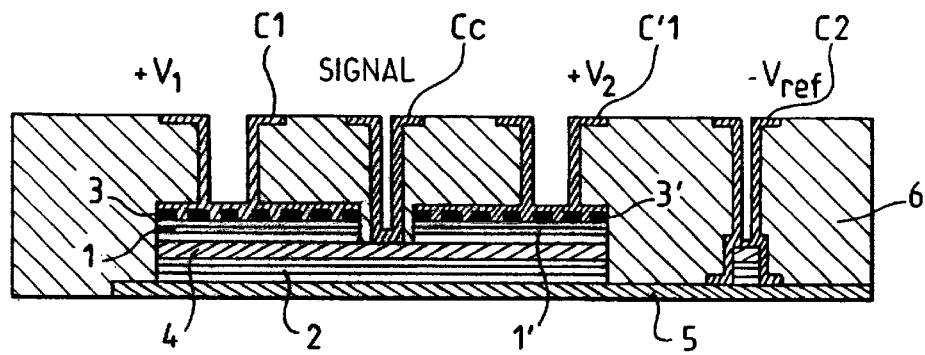
FIG. 3, an example of the structure of a detector according to the invention.
Figure 5:
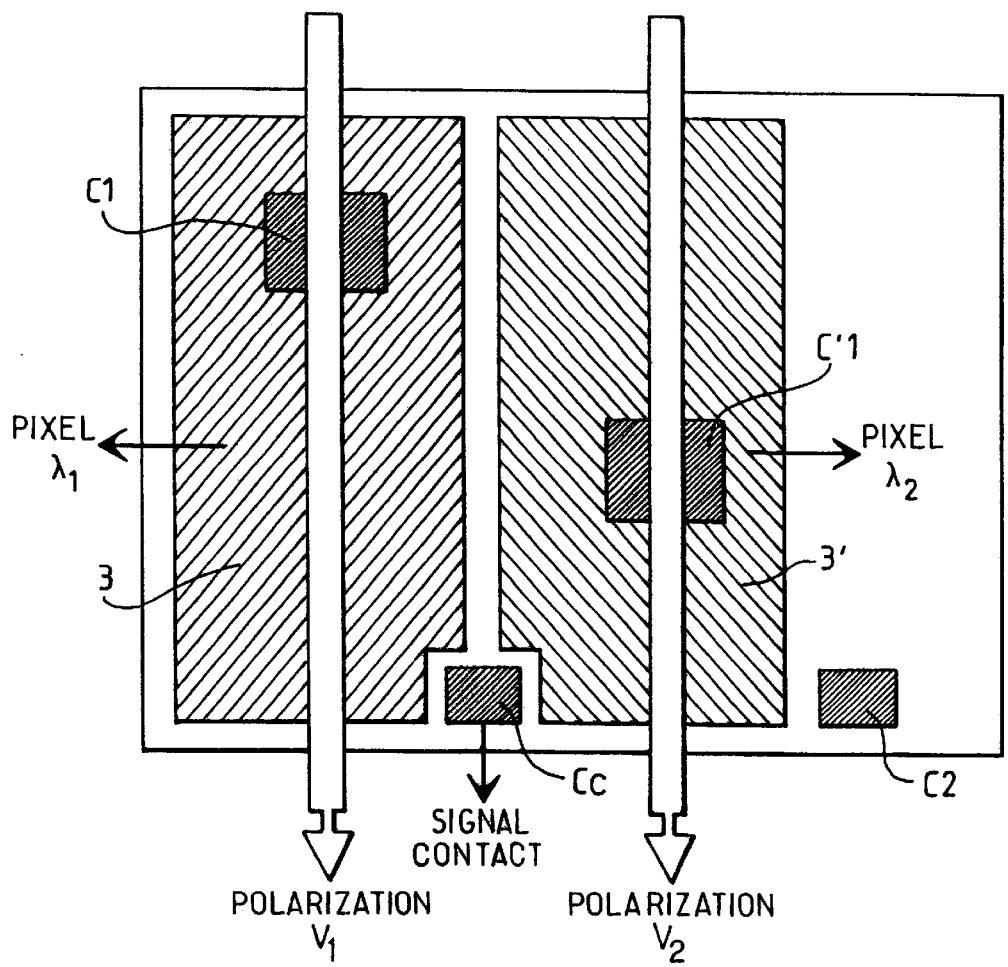
FIG. 5, a top view of the structure in FIG. 3.

The spectral response of a quantum wells is the convolution of the spectral absorption of the detector and the spectral efficiency induced by geometric resonance of the diffraction grating used for optical coupling of the incident radiation. Thus, a diffraction grating resonating at about $\lambda_1$ (or $\lambda_2$) combined with the previously described quantum structure will induce a response centered around $\lambda_1$ (or $\lambda_2$) (FIG. 4). The principle of the invention is to separate the main pixel with size a×a into two sub-pixels with size a×a/2, each of these sub-pixels having a conventional subtractive structure, but comprising two different coupling gratings (FIGS. 3 and 5).

Polarization of the lower stage Vref common to all pixels in the matrix remains common to the two types of sub-pixels. On the other hand, polarization of the upper stage that is also common to all pixels in the matrix needs to be duplicated in this case, since each sub-network of sub-pixels is polarized in a common manner. In this case, connections for the upper stage are achieved by two polarization lines $V_1$ and $V_2$ per pixel instead of a single line for a standard subtractive pixel (FIG. 5).

Figures 6, 7:
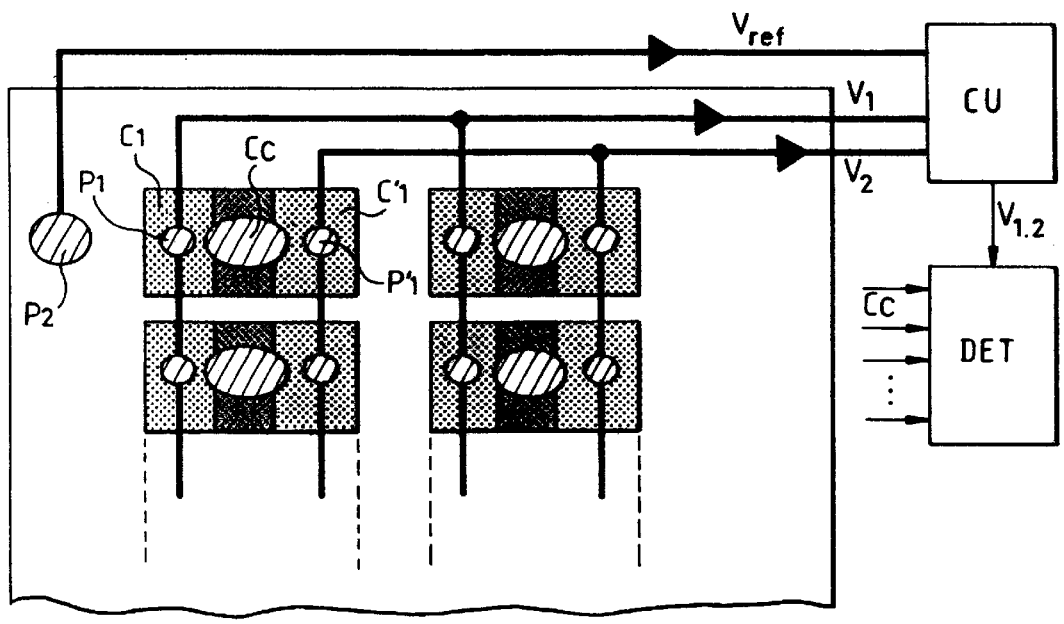
FIG. 6, a matrix of detectors according to the invention.
FIG. 7, a table of operating modes.

In this case, the device may be used in three subtraction modes corresponding to three spectral curves $\Delta\lambda_1$, $\Delta\lambda_2$ and $\Delta\lambda_1+\Delta\lambda_2$ that are different depending on the voltages applied to each of the upper electrodes (FIG. 6).

According to one preferred embodiment of the invention, an optical detector is made on a transparent substrate through which incident light reaches the detector. This type of optical detector comprises a structure like that shown in FIG. 3 on the substrate. This structure comprises a first purely resistive contact layer 5 on one surface of the substrate, this purely resistive contact layer being transparent. A stack of layers 2 is placed on this purely resistive contact layer, forming a stack of quantum wells capable of detecting two ranges of wavelengths $\lambda_1$ and $\lambda_2$. A second transparent purely resistive contact layer 4 is formed on top of this stack of layers. There are two stacks of identical or quasi-identical layers 1, 1' on the second purely resistive contact layer 4, each forming an alternating stack of quantum wells capable of detecting wavelength ranges $\lambda_1$ and $\lambda_2$, and finally there are diffraction gratings 3 and 3' with different structures on these stacks of layers, such that these gratings each enable coupling either light at wavelength $\lambda_1$ or light at wavelength $\lambda_2$, in the stack of layers (1, 1' on which it is made). As shown in FIG. 3, the assembly is encapsulated in an insulation layer 6 and connection means pass through this insulation layer to reach the diffraction gratings and to form connection means C1 and C'1 in order to apply voltages +V1 and +V2 respectively to diffraction gratings 3 and 3'. Also, at least one connection means passes through the insulation layer and reaches the second purely resistive contact layer 4 in order to make the common contact Cc for reading the photoconduction signal. And finally, a connection means C2 is formed located on the first purely resistive contact layer 5 in order to apply the voltage −Vref to the entire structure.

FIG. 5 shows a top view of a pair of detection elements like that shown in FIG. 3. In the example embodiment in FIG. 3, the stack of layers of quantum wells 2 actually forms two elementary detectors, each detector being associated with a detector element 1 or 1' in order to eliminate the background noise as explained in French patent No. 2 756 666.

The stacks of layers of quantum wells 1, 1', 2 are active or photoconducting at the same ranges of wavelengths $\lambda_1$ and $\lambda_2$. The stacks of layers 1 and 1' are designed to be more absorbent at wavelengths $\lambda_1$ and $\lambda_2$ than the stack of layers 2. The stack of layers 2 is preferably designed so that it is almost non-absorbent. This may be achieved by using different thicknesses of stacks of layers or by more concentrated doping of the layers of quantum wells for the most absorbent stacks.

Since the detector is illuminated by incident radiation on the purely resistive contact layer 5, the stack of layers 2 receives the radiation first.

Therefore, the radiation passes through the stack of layers 2, and then through the stacks in layers 1 and 1', and they are coupled through diffraction gratings 3 and 3', depending on the received wavelength ($\lambda_1$ and $\lambda_2$) in the stacks of layers 1 and 1'.

If the diffraction grating 3 is designed to couple light at wavelength $\lambda_1$, light at wavelength $\lambda_1$ will be diffracted towards the stack of layers 1 and will be absorbed or almost absorbed by this stack of layers. Similarly, if the diffraction grating 3' is designed to diffract light at wavelength $\lambda_2$, light will be absorbed or almost absorbed by the stack of layers 1'.

FIG. 6 shows a matrix embodiment of a matrix detector according to the invention. This figure shows four optical detectors like those described above, as an example. Therefore, each detector comprises two detector elements each with its diffraction grating. Essentially, this figure shows connection means enabling matrix type control of this matrix of detectors. Therefore, FIG. 6 shows that the connection means C1 are interconnected through their pin P1 to the control potential V1. Similarly, the connection means C'1 are interconnected through their connection pin P'1 at the same control potential V2. The common contact layer to which a pin P2 is connected, is connected to the reference potential Vref. Finally, a connection means Cc is placed in the central part of each detector in order to connect an individual means of measuring the current for each detector.

FIG. 6 also shows a control circuit CU to output the reference potential Vref and control potentials V1 and V2.

A detection circuit DET receives information v1.2 from the control circuit CU indicating the control mode output by the CU circuit (potentials V1 and/or V2). It also receives read signals output by each pixel on its common contact means Cc.

FIG. 7 contains a control table for the detectors thus made. This table thus symbolizes a means of controlling detectors. As can be seen in this FIG. 7, a reference potential Vref is applied to the different detectors in the operating mode. When a potential V1 is applied to a detector and the potential V2 is not applied, this detector detects the wavelength $\lambda_1$. Conversely, if a potential V2 is applied but a potential V1 is not applied to a detector, this detector detects the wavelength $\lambda_2$. Finally, if potentials V1 and V2 are both applied to a detector at the same time, the detector detects wavelengths $\lambda_1$ and $\lambda_2$.

The normal operating mode may be considered as being the third mode in order to acquire the maximum signal. Use in modes 1 and 2 alternately is a means of adding a thermometry or passive telemetry function. Finally, if there is any optical aggression preventing measurements in one of the two spectral windows $\lambda_1$ or $\lambda_2$, it is found that the system can continue to operate and acquire the signal in the other spectral window.

We will now describe an example embodiment of a detector according to the invention. In order to simplify the description, we will describe the manufacture of a detector with two detection elements like the detector in FIG. 3, but this process could be applied for the manufacture of a detectors matrix.

This process includes the following steps:

A first purely resistive contact layer 5 is made on a transparent substrate (not shown in FIG. 3), transparent to the wavelengths to be detected.

A stack of quantum wells is made on this second purely resistive contact layer, that is photoconducting within wavelength ranges $\lambda_1$ and $\lambda_2$.

A second stack of quantum wells that is photoconducting at the wavelengths to be detected is formed on the second purely resistive contact layer.

Two diffraction gratings with different characteristics are formed on this second stack. For example, these two gratings can be used to diffract light to the second stack of quantum wells, each for different wavelengths $\lambda_1$ and $\lambda_2$.

Finally, the geometry of each detector is limited by etching. This is done by etching all layers until the first purely resistive contact layer 5. A chase is also made between two detection elements at the boundary between the two gratings 3 and 3' in order to separate the stacks in layers 1 and 1' from the two detection elements.

An encapsulation insulation layer 6 is deposited on the assembly thus formed.

Finally, connection means are made. This is done by making the following holes:
(a) holes passing though the insulation layer as far as diffraction gratings 3 and 3' that are metallized to form connection means C1 and C'1;
(b) the common connection hole passing through the insulation layer and the second stack as far as the second purely resistive contact layer to form the common connection means Cc to create the read signal;
(c) a hole passing through the insulation layer and reaching the first purely resistive contact layer 5 in order to make the connection means C2.

Note that in the above, diffraction gratings 3 and 3' may be metallized for application of potentials V1 and V2.

Thus the process according to the invention is used to make the detector in FIG. 3. Several detectors designed in this way should be etched on the first purely resistive contact layer, in order to create a detectors matrix.

What is claimed is:

1. A bi-functional optical detector comprising:
a first active photoconduction detection element configured to detect light within first and second wavelength ranges;
a first diffraction grating associated with the first detection element and configured to couple the light within the first wavelength range so that the first active photoconducting detection element detects the light in the first wavelength range;
a second active photoconduction detection element configured to detect light within the first and second wavelength ranges;

a second diffraction grating associated with the second detection element and configured to couple the light within the second wavelength range so that the second active photoconduction detection element detects the light in the second wavelength range;

a third active photoconduction detection element associated with the first detection element and configured to detect the light within the first and second wavelength ranges;

a fourth active photoconduction detection element associated with the second detection element and configured to detect the light within the first and second wavelength ranges; and a common contact layer separating the first and second detection elements from the third and fourth detection elements.

2. The optical detector according to claim 1, wherein the common contact layer is a single layer and the third and fourth detection elements are a single detection element.

3. The optical detector according to claim 1, wherein the common contact layer comprises an insulation layer.

4. The optical detector according to claim 1, wherein the first and second detection elements comprise a same layer of photoconducting material.

5. The optical detector according to claim 4, wherein the first and second detection elements comprise stacks of layers forming respective quantum wells.

6. The optical detector according to claim 4, wherein the first and second detection elements comprise an alternation of at least two types of quantum wells, each type enabling detection of a determined wavelength.

7. The optical detector according to claim 1, wherein the first, second, third and four detection elements detect a same wavelength range.

8. The optical detector according to claim 7, wherein a response of each of the first and second detection elements is significantly greater than a response of the third and fourth detection elements such that the first and second detection elements absorb light energy at a wavelength range for which the respective detection element is photoconducting.

9. The optical detector according to claim 8, wherein the first and second diffraction gratings comprise a conducting material and each comprises corresponding first and second contact layers configured to apply voltages to the first and second diffraction gratings, and wherein the optical detector further comprises:
a third contact layer connected to faces of the first, second, third and fourth detection elements via contact with the common contact layer;
a fourth contact layer contacting faces of the third and fourth detection elements opposite the common contact layer;
a voltage source configured to apply control voltages to the first, second and fourth contact layers; and
a measuring mechanism configured to measure current conduction connected to the third contact layer so as to measure the photoconduction of the first, second, third and fourth detection elements.

10. The optical detector according to claim 9, further comprising:
a control mechanism configured to apply a reference voltage to the fourth contact layer and one of:
a first control voltage at the first contact layer to control operation of the first and third detection elements,
a second control voltage at the second contact layer to control operation of the second and fourth detection elements, and
two voltages at the first and second contact layers to control operation of the first, second, third and fourth detection elements.

11. A process for making an optical detector comprising:
forming a first resistive contact layer on a face of a transparent substrate;
forming a first stack of quantum wells on the first resistive contact layer for detecting light within first and second wavelength ranges;
forming a second resistive contact layer on the first stack of quantum wells;
forming a second stack of quantum wells on the second resistive contact layer for detecting light within the first and second wavelength ranges;
forming at least two diffraction gratings with different physical structures on a surface of the second quantum wells;
etching a resulting assembly until the first resistive contact layer is reached to form at least two detection elements, one of the detection elements comprising a first physical type of diffraction grating and the other detection element comprising another physical type of diffraction grating;
encapsulating the resulting assembly in an insulation layer;
etching holes in the insulation layer to reach the first and second diffraction gratings, and metallizing the holes in the insulation layer to make first and second contact layers for applying voltages to the first and second diffraction gratings;
forming at least one hole for each pair of detection elements, and reaching the second resistive contact layer and metallizing said at least one hole to form a third contact layer;
forming a hole passing through the insulation layer and reaching the first resistive contact layer, and metallizing the hole passing through the insulation layer to make a fourth contact layer.

12. A bi-functional optical detector comprising:
a matrix of detection elements, each detection element including,
a first active photoconduction detection element configured to detect light within first and second wavelength ranges,
a first diffraction grating associated with the first detection element and configured to couple the light within the first wavelength range so that the first active photoconducting detection element detects the light in the first wavelength range,
a second active photoconduction detection element configured to detect light within the first and second wavelength ranges,
a second diffraction grating associated with the second detection element and configured to couple the light within the second wavelength range so that the second active photoconduction detection element detects the light in the second wavelength range,
a third active photoconduction detection element associated with the first detection element and configured to detect the light within the first and second wavelength ranges,
a fourth active photoconduction detection element associated with the second detection element and configured to detect the light within the first and second wavelength range, a common contact layer separating the first and second detection elements from the third and fourth detection elements, first and second contact layers configured to apply voltages to the first and second diffraction gratings, a third contact layer connected to faces of the first, second, third and fourth detection elements via contact with the common contact layer, and a fourth contact layer contacting faces of the third and fourth detection elements opposite the common contact layer, wherein the fourth contact layer is common to all detection elements in the matrix such that a voltage is applied to said all detection elements, all of the first contact layers are connected to each other so that the first control voltage is applied to all of the first detection elements, and all of the second contact layers are connected to each other so that the second control voltage is to all of the second detection elements.

13. A bi-functional optical detector comprising:

first active photoconduction detection means for detecting light within first and second wavelength ranges;

first diffraction grating means associated with the first detection means and for coupling the light within the first wavelength range so that the first active photoconducting detection means detects the light in the first wavelength range;

second active photoconduction detection means for detecting light within the first and second wavelength ranges; and second diffraction grating means associated with the second detection means and for coupling the light within the second wavelength range so that the second active photoconduction detection means detects the light in the second wavelength range; and third active photoconduction detection means associated with the first detection means and for detecting the light within the first and second wavelength ranges;

fourth active photoconduction detection means associated with the second detection means and for detecting the light within the first and second wavelength ranges; and insulation means for separating the first and second detection means from the third and fourth detection means.

14. The optical detector according to claim 13, wherein the insulation means is a single layer of an insulating material and the third and fourth detection means are a single detection element.

15. The optical detector according to claim 13, wherein the first and second detection means comprise a same layer of photoconducting material.

16. The optical detector according to claim 15, wherein the first and second detection means comprise stacks of layers forming respective quantum wells.

17. The optical detector according to claim 15, wherein the first and second detection means comprise an alternation of at least two types of quantum wells, each type detection of a determined wavelength.

18. The optical detector according to claim 13, wherein the first, second, third and fourth detection means detect a same wavelength range.

19. The optical detector according to claim 18, wherein a response of each of the first and second detection means is significantly greater than a response of the third and fourth detection means such that the first and second detection means absorb light energy at a wavelength range for which the respective detection means is photoconducting.

20. The optical detector according to claim 19, wherein the first and second diffraction gratings means comprise a conducting material and each comprises corresponding first and second contact means for applying voltages to the first and second diffraction gratings means, and wherein the optical detector further comprises:
 third contact means connected to faces of the first, second, third and fourth detection means via contact with the insulation means;
 fourth contact means contacting faces of the third and fourth detection opposite the insulation means;
 voltage applying means for applying control voltages to the first, second and fourth contact means;
 measuring current conduction connected to the third contact means so as to measure the photoconduction of the first, second, third and fourth detection means.

21. The optical detector according to claim 20, further comprising:

control means for applying a reference voltage to the fourth contact means and one of:
 a first control voltage at the first contact means for controlling operation of the first and third detection means;
 a second control voltage at the second contact means for controlling operation of the second and fourth detection means; and
 two voltages at the first and second contact means for controlling operation of the first, second, third and fourth detection means.

* * * * *